(12) United States Patent
Moizumi et al.

(10) Patent No.: US 7,619,722 B2
(45) Date of Patent: Nov. 17, 2009

(54) LENS REPLACING METHOD AND MANUFACTURING METHOD FOR ALTERNATIVE LENS

(75) Inventors: Jun Moizumi, Utsunomiya (JP); Ryo Koizumi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 12/195,322

(22) Filed: Aug. 20, 2008

(65) Prior Publication Data

US 2009/0051903 A1 Feb. 26, 2009

(30) Foreign Application Priority Data

Aug. 20, 2007 (JP) ............................. 2007-213824

(51) Int. Cl.
*G01B 9/00* (2006.01)
*G01M 11/00* (2006.01)
(52) U.S. Cl. ..................... 356/124; 356/124.5; 356/126; 356/127
(58) Field of Classification Search ................. 356/124, 356/124.5, 125, 126, 127, 614, 622; 359/557, 359/618, 629, 651, 690, 691, 648, 720; 355/52–53, 355/55, 67
See application file for complete search history.

(56) References Cited

U.S. PATENT DOCUMENTS

| | | | | |
|---|---|---|---|---|
| 4,132,479 A | * | 1/1979 | Dubroeucq et al. | 355/71 |
| 4,545,678 A | * | 10/1985 | Grimm et al. | 356/124 |
| 5,648,871 A | * | 7/1997 | Okuyama et al. | 359/557 |
| 5,793,473 A | * | 8/1998 | Koyama et al. | 355/55 |
| 5,815,233 A | * | 9/1998 | Morokawa et al. | 349/200 |
| 6,243,350 B1 | * | 6/2001 | Knight et al. | 369/126 |
| 6,256,086 B1 | * | 7/2001 | Sumiyoshi | 355/55 |
| 6,903,827 B2 | * | 6/2005 | Kitabayashi et al. | 356/614 |
| 7,061,698 B2 | | 6/2006 | Osterried et al. | |
| 2004/0169836 A1 | | 9/2004 | Wegmann | |
| 2006/0187430 A1 | | 8/2006 | Dodoc et al. | |

FOREIGN PATENT DOCUMENTS

| | | |
|---|---|---|
| JP | 10-221029 A | 8/1998 |
| JP | 2002-286989 A | 10/2002 |
| JP | 2003-029117 A | 1/2003 |
| JP | 2005-268412 A | 9/2005 |
| JP | 2006-073687 A | 3/2006 |
| JP | 2006-287140 A | 10/2006 |

* cited by examiner

*Primary Examiner*—Sang Nguyen
(74) *Attorney, Agent, or Firm*—Canon U.S.A., Inc. I.P. Division

(57) ABSTRACT

A method for replacing a lens having refractive power in a first projection optical system includes measuring a wavefront of measuring light passing through the first projection optical system in a state in which the lens having refractive power or a master lens is mounted in the first projection optical system, measuring a wavefront of measuring light passing through a second projection optical system in a state in which the master lens or an alternative lens is mounted in the second projection optical system, processing the alternative lens in accordance with measurement results, and replacing the lens having refractive power in the first projection optical system with the processed alternative lens.

13 Claims, 5 Drawing Sheets

| ITEM | SIGN | REQUIRED ACCURACY | STANDARD |
|---|---|---|---|
| CURVATURE | $\Delta R$ (Newton) | 0.03 ring | 3 rings |
| THICKNESS | $\Delta D$ | 0.04 um | 1.0 um |
| AVERAGE REFRACTIVE INDEX | $\Delta N$ | 0.1 ppm | 10.0 ppm |
| REFRACTIVE-INDEX UNIFORMITY | $\Delta HOMO$ | 27.0 ppb | 1.0 ppm |

LENS REPLACING METHOD AND MANUFACTURING METHOD FOR ALTERNATIVE LENS

BACKGROUND OF THE INVENTION

1. Field of the Invention

The present invention relates to a method for replacing a lens having refractive power in a projection optical system that projects a pattern of an original body (such as a mask) illuminated with exposure light onto a substrate with an alternative lens, and to a method for manufacturing the alternative lens.

2. Description of the Related Art

Projection exposure apparatuses have been used to manufacture devices such as semiconductor devices and liquid crystal devices. Further, according to demands for finer circuit patterns, the resolution of such projection optical systems has been improved.

On the other hand, the allowance for contamination of the lens in the projection optical system has considerably decreased in order to maintain high resolution. This is because, when a foreign substance adheres to a surface of the lens in the projection optical system, transmittance of the lens decreases, uneven illuminance occurs, and resolution deteriorates.

Accordingly, a replaceable optical element is used in the projection optical system, and is replaced when contaminated. More specifically, a replaceable parallel plate is placed at a side of the projection optical system closest to a wafer. Even when mounting error of the parallel plate is caused by replacement (even when the parallel plate is displaced), there is little influence on aberration of the projection optical system.

The parallel plate is also replaced in order to reduce aberration of the projection optical system due to temporal change. A procedure for replacing the parallel plate will now be described with reference to FIG. 6 serving as a flowchart.

When performance of an exposure apparatus decreases at the user's site, first, a wavefront aberration of a projection optical system U installed in the exposure apparatus is measured (Step S61). Then, a replaceable parallel plate is taken out of the projection optical system U (Step S62). The parallel plate is returned to a manufacturing plant of a manufacturer of the exposure apparatus, and a surface shape of the parallel plate is measured at the manufacturing plant (Step S63). On the basis of the measured surface shape and the wavefront aberration measured in Step S61, a surface shape (aspherical surface) of the parallel plate that can reduce the wavefront aberration is calculated (Step S64), and an alternative parallel plate is processed so as to have the calculated surface shape (Step S65). The processed alternative parallel plate having a new surface shape is delivered to the user, and is then mounted in the projection optical system U that is installed in the exposure apparatus (Step S66).

Alternatively, it has been proposed that an alternative optical element is used to reduce assembly error of a projection optical system (see Japanese Patent Laid-Open Nos. 2006-287140, 2005-268412, and 2003-29117).

In recent years, immersion exposure apparatuses have come onto the market. In an immersion exposure apparatus, liquid (for example, pure water) fills the space between a final lens of a projection optical system and a wafer. For this reason, there is a possibility that contaminants from a resist applied on a surface of the wafer adhere to the final lens in contact with the liquid, and that a surface of the final lens will thereby be subjected to fogging, which does not occur in dry-type exposure apparatuses.

Compared with dry-type exposure apparatuses, the final lens is very close to the wafer in immersion exposure apparatuses. For this reason, near the wafer, exposure light from an exposure light source is collected, and illuminance increases. As a result, the refractive index of a lens material of the final lens may be easily changed, and this may deteriorate optical performance of the projection optical system.

Accordingly, it is necessary to periodically replace the final lens in order to remove the influence of fogging and changes in the refractive index of the final lens on the optical performance of the projection optical system.

In order to increase the numerical aperture NA of the projection optical system in the immersion exposure apparatus, the final lens of the projection optical system needs to be a convex lens having a positive refractive power. If an optical element to be replaced is a parallel plate, mounting error caused by replacement has little influence on the optical performance of the projection optical system, as described above. In contrast, mounting error (for example, displacement in the direction of the optical axis of the projection optical system) of a lens having refractive power significantly affects the optical performance of the projection optical system. Therefore, it is necessary to mount the final lens in the immersion exposure apparatus with very high precision.

When the projection optical system has a high resolution, the difference in shape (curvature, thickness, etc.) between exchanged final lenses, that is, the current final lens and an alternative lens thereto, has a great influence on the optical performance of the projection optical system. Therefore, it is necessary to process the alternative lens in the immersion exposure apparatus with very high precision.

Further, when the numerical aperture NA of the projection optical system is large, the final lens is designed to have a small radius of curvature, that is, have a large refractive power in order to reduce the outer shape of the projection optical system. Such a lens having a large refractive power is thick. As the thickness of the lens increases, aberration caused in the projection optical system because of decentration of the lens and nonuniform refractive index of the lens material increases. In the case of a parallel plate, the influences of decentration and nonuniform refractive index can be reduced by decreasing the thickness of the parallel plate. In contrast to the parallel plate, it is difficult to decrease the thickness of the final lens in the immersion exposure apparatus, and therefore, the influences of decentration and nonuniform refractive index are difficult to reduce.

SUMMARY OF THE INVENTION

The present invention provides a lens replacing method that can minimize a change in optical performance of a projection optical system caused by replacing a lens having refractive power.

A lens replacing method according to an embodiment of the present invention replaces a predetermined lens having a non-zero refractive power in a projection optical system configured to project a pattern of an original body illuminated with exposure light onto a substrate. The lens replacing method includes mounting the predetermined lens in a first projection optical system; measuring a wavefront of measuring light passing through the first projection optical system including the predetermined lens to obtain a first measurement result; mounting a master lens corresponding to the predetermined lens in the first projection optical system; measuring a wavefront of measuring light passing through the first projection optical system including the master lens to obtain a second measurement result; installing the first projection optical system with the predetermined lens mounted therein into an exposure apparatus; mounting an alternative lens to the predetermined lens in a second projection optical system having the same specifications as those of the first projection optical system; measuring a wavefront of measuring light passing through the second projection optical system including the alternative lens to obtain a third measurement result; mounting the master lens in the second projection optical system; measuring a wavefront of measuring light passing through the second projection optical system including the master lens to obtain a fourth measurement result; processing the alternative lens in accordance with a difference obtained by subtracting the difference between the first and second measurement results from the difference between the third and fourth measurement results; removing the predetermined lens from the first projection optical system installed in the exposure apparatus; and mounting the processed alternative lens in the first projection optical system.

Further features of the present invention will become apparent from the following description of exemplary embodiments with reference to the attached drawings.

DESCRIPTION OF THE EMBODIMENTS

The present invention will be described in detail below with reference to the attached drawings.

Figure 1:
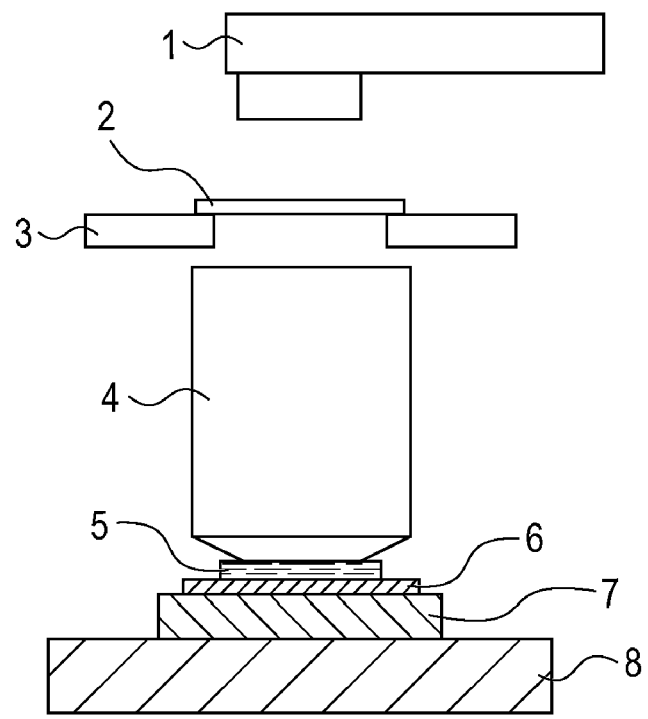
FIG. 1 shows an exposure apparatus according to an exemplary embodiment of the present invention.

FIG. 1 is a schematic view of an exposure apparatus according to an exemplary embodiment of the present invention. Hereinafter, the same or equivalent components are denoted by the same reference numerals, and redundant description is avoided.

In the exposure apparatus, an illumination optical system 1 illuminates a reticle 2 placed on a reticle stage 3 with exposure light from an exposure light source (not shown). Liquid 5 is provided to fill the space between a projection optical system 4 and a wafer 6. The projection optical system 4 projects a circuit pattern provided on the reticle 2 onto the wafer 6 through the liquid 5. The wafer 6 is held by a wafer chuck 7 that is fixed to a wafer stage 8.

The projection optical system 4 is a refractive or catadioptric projection optical system. The reticle 2 is an original body, and is sometimes called a mask. While the wafer 6 is used as a photosensitive substrate in this exemplary embodiment, a glass plate may be used instead. The wafer or glass plate 6 is coated with a resist. As the liquid 5, pure water or an organic liquid can be used.

Figure 2:
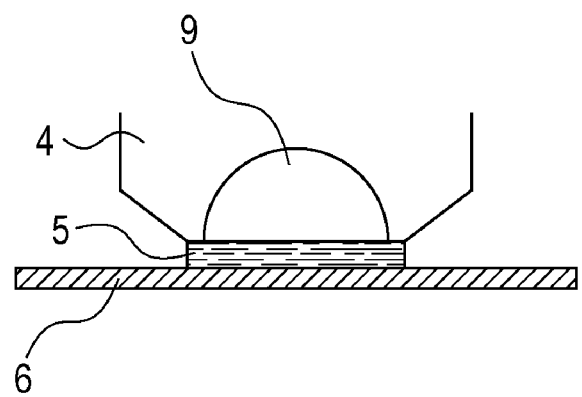
FIG. 2 shows a final lens and its surroundings in the exposure apparatus shown in FIG. 1.

FIG. 2 is an enlarged view of a final lens 9 and its surroundings in the projection optical system 4.

The final lens 9 is a planoconvex lens. However, when liquid having a high refractive index is used as the liquid 5, a meniscus lens is sometimes used as the final lens 9. Since the final lens 9 is in contact with the liquid 5 at a surface (final surface) facing the wafer 6, it is susceptible to fogging. Moreover, since the final lens 9 is designed so as to have a large refractive power and to be provided at a short distance from the wafer 6, the refractive index of the final lens 9 is susceptible to change (for example, via compaction) by exposure to light, as described above. Therefore, it is periodically necessary to replace the final lens at the user's site where the exposure apparatus is installed.

Figures 4, 5:
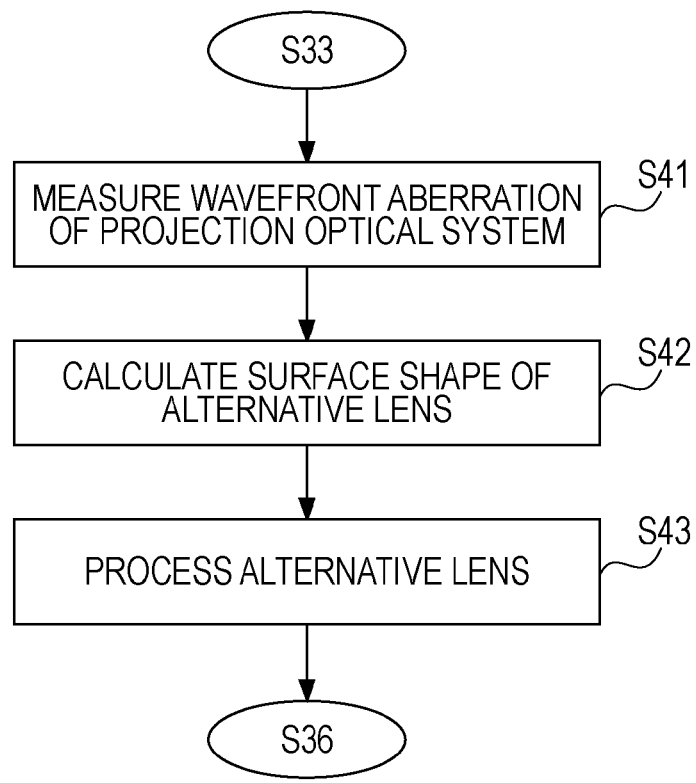
FIG. 4 is a flowchart showing a lens processing procedure.
FIG. 5 is a table showing required accuracies of the final lens.
Figure 6:
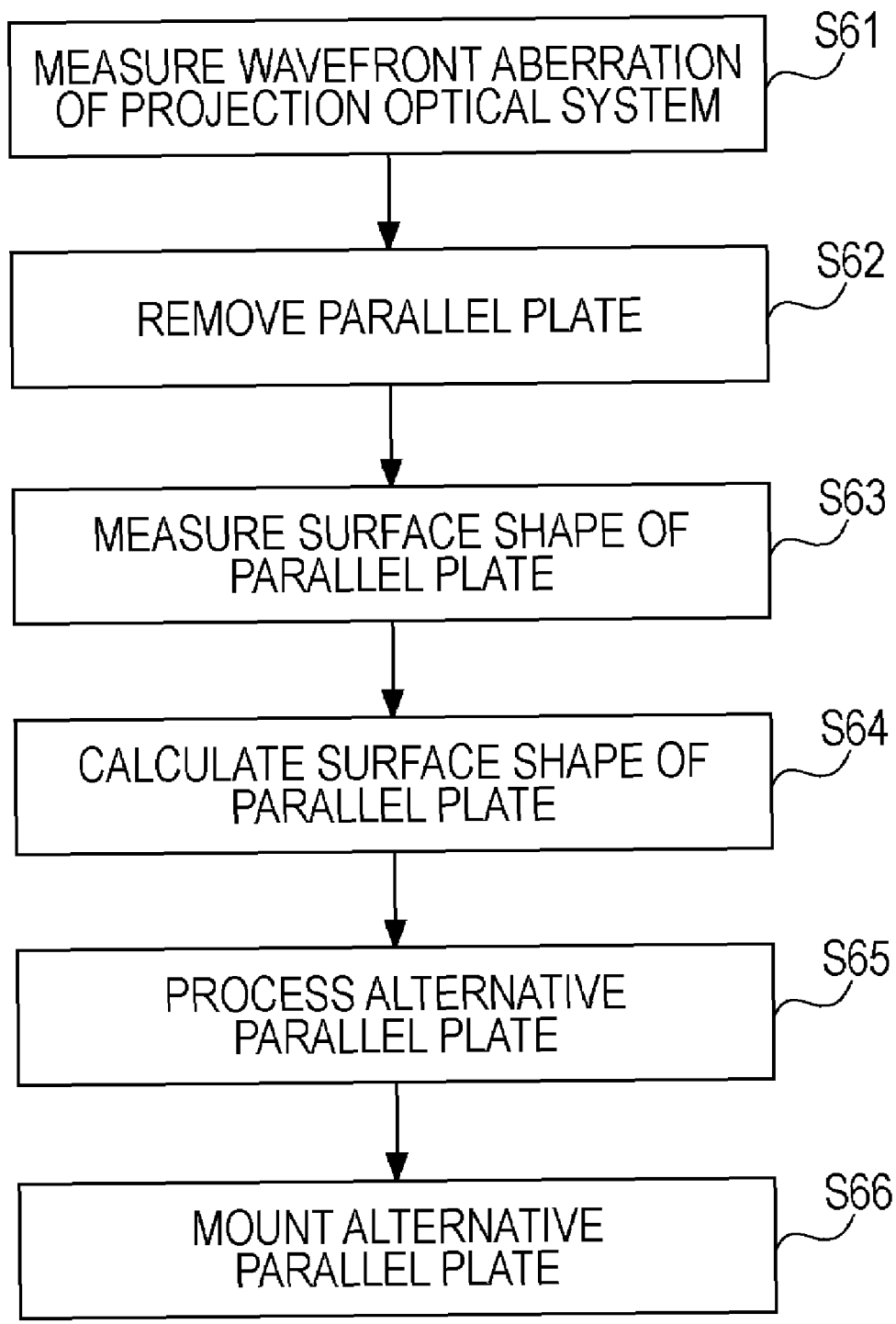
FIG. 6 is a flowchart showing a lens replacing procedure preformed in a related art.

A wavefront aberration of the projection optical system required for existing immersion exposure apparatuses is 6.0 m$\lambda$ or less in RMS value. FIG. 5 shows the required accuracies (tolerances) of curvature, thickness, average refractive index, and refractive-index uniformity of the final lens in this case. The required accuracies (tolerances) of curvature, thickness, average refractive index, and refractive-index uniformity of a standard high-accuracy lens are shown in the rightmost column of the table in FIG. 5.

The tolerance of curvature of a standard high-accuracy lens is about 3 Newton's rings. In contrast, the tolerance of curvature of the final lens is one hundredth of that of a standard high-accuracy lens, that is, 0.03 Newton's rings. While the measuring accuracy of commercially available thickness measurement devices is generally about 1.0 um, the tolerance of thickness of the final lens is less than the measuring accuracy. The tolerances of average refractive index and refractive-index uniformity of a lens material of the final lens are significantly stricter than those of the standard high-accuracy lens.

Therefore, it is difficult to manufacture a final lens that satisfies the required accuracies of all items, and it is more difficult to manufacture an alternative lens to the final lens for use as a replacement lens.

However, as will be described below, the required accuracies of the final lens and the alternative lens can be relaxed by ensuring optical performances of the lenses in terms of a transmission wavefront.

Assuming that an allowed wavefront aberration of the projection optical system is up to 7 m$\lambda$ in RMS value after the final lens is replaced, the wavefront aberration can be decreased by replacement by the following amount:

$$\sqrt{(7^2-6^2)}=3.6$$

In other words, by limiting the change in wavefront aberration due to replacement of the final lens, including error of mounting in the projection optical system, to 3.6 m$\lambda$ or less, the wavefront aberration of the projection optical system after replacement of the final lens can be limited to 7 m$\lambda$ or less.

Further, by decreasing the mounting error in the change (3.6 m$\lambda$), most of the decrease can be provided for the error of the final lens. For example, when it is assumed that the mounting error of the final lens can be decreased to 1 m$\lambda$, the error of the final lens is as follows:

$$\sqrt{(3.6^2-1^2)}=3.5$$

In other words, by processing the surface shape of the alternative lens so that the difference in wavefront aberration between the final lens and the alternative lens is 3.5 m$\lambda$ or less, the projection optical system can satisfy the required accuracies even after the final lens is replaced.

Figure 3:
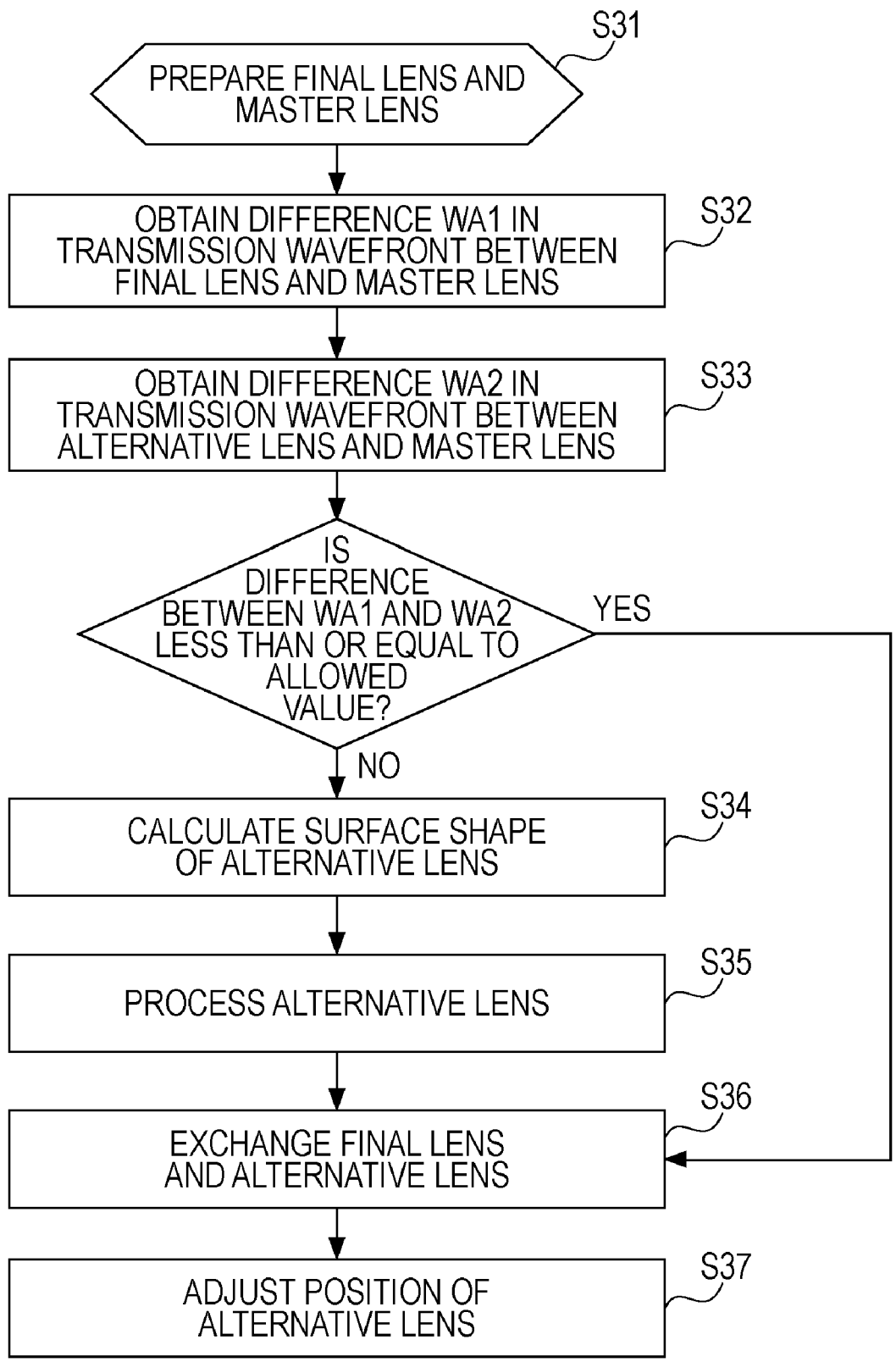
FIG. 3 is a flowchart showing a lens replacing procedure.

A method for replacing the final lens 9 in this exemplary embodiment will be explained below with reference to FIG. 3 serving as a flowchart.

In the exemplary embodiment, the optical performance of the final lens is not ensured in terms of surface shape or refractive index, but is ensured in terms of transmission wavefront.

Figure 7:
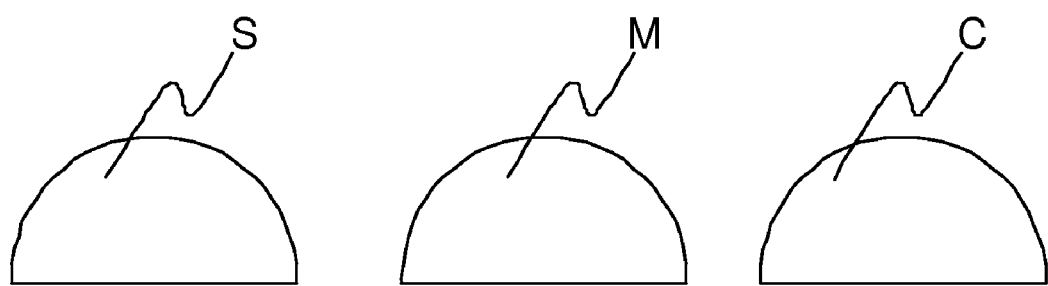
FIG. 7 shows a final lens (predetermined lens) S, a master lens M, and alternative lens C.

First, a final lens (predetermined lens) S and a master lens M, which has almost the same shape as that of the final lens S as shown in FIG. 7 and is formed of the same material as that of the final lens 5, are prepared (Step S31).

The final lens S is mounted in a projection optical system U1 (first projection optical system), and a wavefront of measuring light passing through the projection optical system U1 is measured with a wavefront measuring device. The wavefront measuring device measures wavefront aberration of the entire projection optical system U1 as a transmission wavefront. The final lens S is mounted with a mounting tool that can limit displacement due to mounting within a range of measurement linearity of the wavefront measuring device (hereinafter, this tool will always be used to mount a lens in the projection optical system). As the measuring light, exposure light from an exposure light source or light from a light source different from the exposure light source can be used. Preferably, the wavelength of the measuring light is equal to the wavelength of the exposure light.

By this measurement, a first measurement result corresponding to mounting of the final lens S can be obtained. The measured transmission wavefront is designated as Wab_S (U1).

Next, the master lens M is mounted in the projection optical system U1, instead of the final lens S, and a wavefront of measuring light passing through the projection optical system U1 is measured with the wavefront measuring device. By this measurement, a second measurement result corresponding to mounting of the master lens M can be obtained. The measured transmission wavefront is designated as Wab_M(U1).

Then, a difference WA1 between the transmission wavefront Wab_S(U1) and the transmission wavefront Wab_M (U1) is calculated and stored (Step S32).

The difference WA1 represents information about the difference in performance between the final lens S and the master lens M. There is a possibility that the transmission wavefront includes an error component because of mounting error of the final lens S and the master lens M. However, this error component of the transmission wavefront can be removed on the basis of displacement sensitivity of the lens calculated beforehand.

The projection optical system U1 in which the final lens S is mounted is installed in an exposure apparatus, and the exposure apparatus is then shipped to the user.

On the other hand, an alternative lens C is mounted in a projection optical system (second projection optical system) Ux designed to have the same specifications as those of the projection optical system U1, and a wavefront of measuring light passing through the projection optical system Ux is measured with the wavefront measuring device. The alternative lens C has almost the same shape as that of the final lens S as shown in FIG. 7 and is formed of the same material as that of the final lens S. By this measurement, a third measurement result corresponding to mounting of the alternative lens C can be obtained. The measured transmission wavefront is designated as Wab_C(Ux).

Instead of the alternative lens C, the master lens M is mounted in the projection optical system Ux, and a wavefront of measuring light passing through the projection optical system Ux is measured with the wavefront measuring device. By this measurement, a fourth measurement result corresponding to mounting of the master lens M can be obtained. The measured transmission wavefront is designated as Wab_M(Ux). It is preferable that the conditions of measurement using the projection optical system Ux be equal to those adopted for the above-described projection optical system U1. For example, it is preferable that the wavelength of the measuring light be equal between measurements using both projection optical systems U1 and Ux. Further, it is preferable to pass the measuring light through the same region in the final lens S, the master lens M, and the alternative lens C.

A difference WA2 between the transmission wavefront Wab_C(Ux) and the transmission wavefront Wab_M(Ux) is calculated and stored (Step S33). The difference WA2 represents information about the difference in performance between the alternative lens C and the master lens M. An error component of the transmission wavefront caused by mounting error of the alternative lens C and the master lens M can be removed by a method similar to the above-described method.

When a difference between the difference WA1 and the difference WA2 is less than or equal to an allowed value, the final lens S mounted in the projection optical system U1 installed at the user's site is replaced with the alternative lens C at the necessary replacement time.

By expressing the difference in performance between the final lens S and the alternative lens C in terms of transmission wavefront, as described above, strict required accuracies of shapes, refractive indices and the like in the final lens S and the alternative lens C can be relaxed. This is because the influences of errors, such as shape error and refractive-index error, on performance of the final lens S frequently cancel one another. As long as the transmission wavefront of the final lens S satisfies its required accuracy, there is no problem even when the shape and refractive index of the final lens S do not satisfy their required accuracies.

As long as wavefront aberration of the projection optical system satisfies its required accuracy, the transmission wavefront of the final lens does not always need to satisfy its required accuracy. For this reason, in this exemplary embodiment, the projection optical system designed to have the same specifications is used to ensure performance of the alternative lens.

When the difference between the difference WA1 and the difference WA2 is more than the allowed value, the following procedure is performed.

First, a surface shape of a convex surface of the alternative lens C that reduces the difference between the differences WA1 and WA2 is calculated (Step S34).

Then, the convex surface of the alternative lens C is processed to have the calculated surface shape (Step S35).

The alternative lens C manufactured through Steps S31 to S35 is stored in a state in which it is clear which projection optical system (the projection optical system U1 in the exemplary embodiment) includes the final lens S corresponding to the alternative lens C.

At the necessary replacement time, the final lens S mounted in the projection optical system U1 at the user's site is replaced with the stored alternative lens C (Step S36).

Next, a wavefront aberration of the projection optical system U1 installed in the exposure apparatus is measured with measuring light or exposure light, and a measurement result (sixth measurement result) is obtained. Then, the position of the alternative lens C is finely adjusted so as to reduce the measured wavefront aberration (Step S37).

The tolerance of mounting error of the final lens is less than a micron. Compared with other lenses in the projection optical system, the final lens has a small radius of curvature and a high tilt sensitivity. Therefore, in a case in which the final lens is displaced only by a submicron, for example, if the final lens is tilted, astigmatism of about 20 to 30 mλ occurs.

It is possible to provide a position adjusting mechanism at a lens different from the final lens or a mirror in the projection optical system so as to correct wavefront aberration due to mounting error. However, if too large wavefront aberration to be corrected by the position adjusting mechanism is caused by mounting error of the final lens, there is no choice but to adjust the position of the final lens. For that purpose, it is preferable to provide a position adjusting mechanism capable of precisely adjusting the position of the final lens. As the position adjusting mechanism, a piezo actuator can be used.

When wavefront aberration of the projection optical system U1 at the user's site changes with time, the alternative lens may be processed with consideration of the changed wavefront aberration.

In other words, the following Steps S41 to S43 shown in FIG. 4 serving as a flowchart can be performed between Step S33 and Step S36.

First, in a state in which the projection optical system U1 is installed in the exposure apparatus, a wavefront aberration of the projection optical system U1 is measured with measuring light or exposure light, and a measuring result (fifth measuring result) is obtained (Step S41). Preferably, a region of the final lens S through which the measuring light or exposure light passes during measurement is set to be equal to the regions of the final lens S, the master lens M, and the alternative lens C through which the measuring light passes during the above-described measurement of transmission wavefront. In this case, it is preferable that the position and attitude of the lens or mirror in the projection optical system U1 (including the final lens) be adjusted by the position adjusting mechanism provided at the lens or mirror so that the wavefront aberration of the projection optical system U1 is minimized.

The wavefront aberration measured in Step S41 and the wavefront aberration based on the difference between the difference WA1 and the difference WA2, which has been obtained for replacement of the final lens, are added, and a surface shape (aspherical shape) of the convex surface of the alternative lens C that reduces the sum is calculated (Step S42).

Then, the alternative lens C is processed so as to have the calculated surface shape (Step S43).

According to the above-described lens replacing method of the embodiment, it is possible to minimize the change in optical performance of the projection optical system caused when the final lens having refractive power is replaced. According to the alternative-lens manufacturing method of the embodiment, it is possible to manufacture an alternative lens that can be replaced with little influence on the optical performance of the projection optical system or that can improve the optical performance of the projection optical system by replacement.

In the exemplary embodiment, the method for replacing the final lens in the projection optical system as an example of a lens having a preferred refractive power and the method for manufacturing the alternative lens to the final lens have been described. By applying methods similar to those adopted in the exemplary embodiment to lenses different from the final lens and mirrors in the projection optical system, advantages similar to those of the embodiment can be obtained. For example, a method similar to that adopted in the embodiment may be applied to a lens in the projection optical system closest to the reticle.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2007-213824 filed Aug. 20, 2007, which is hereby incorporated by reference herein in its entirety.

What is claimed is:

1. A lens replacing method for replacing a predetermined lens having a non-zero refractive power in a projection optical system configured to project a pattern of an original body illuminated with exposure light onto a substrate, the lens replacing method comprising:

mounting the predetermined lens in a first projection optical system;

measuring a wavefront of measuring light passing through the first projection optical system including the predetermined lens to obtain a first measurement result;

mounting a master lens corresponding to the predetermined lens in the first projection optical system;

measuring a wavefront of measuring light passing through the first projection optical system including the master lens to obtain a second measurement result;

installing the first projection optical system with the predetermined lens mounted therein into an exposure apparatus;

mounting an alternative lens to the predetermined lens in a second projection optical system having the same specifications as those of the first projection optical system;

measuring a wavefront of measuring light passing through the second projection optical system including the alternative lens to obtain a third measurement result;

mounting the master lens in the second projection optical system;

measuring a wavefront of measuring light passing through the second projection optical system including the master lens to obtain a fourth measurement result;

processing the alternative lens in accordance with a difference obtained by determining a difference between the difference between the first and second measurement results and the difference between the third and fourth measurement results;

removing the predetermined lens from the first projection optical system installed in the exposure apparatus; and mounting the processed alternative lens in the first projection optical system.

2. The lens replacing method according to claim 1, further comprising:

measuring a wavefront of measuring light or the exposure light passing through the first projection optical system with the predetermined lens mounted in a state in which the first projection optical system is installed in the exposure apparatus to obtain a fifth measurement result, wherein the alternative lens is processed in accordance with the difference obtained by subtracting the difference between the first and second measurement results from the difference between the third and fourth measurement results, and in accordance with the fifth measurement result.

3. The lens replacing method according to claim 2, wherein the predetermined lens, the master lens, and the alternative lens have almost the same shape and are formed of the same material, and wherein the measuring light or the exposure light enters the predetermined lens, the master lens, and the alternative lens so as to pass through the same region in the predetermined lens, the master lens, and the alternative lens in obtaining the first to fifth measurement results.

4. The lens replacing method according to claim 1, further comprising:
   measuring a wavefront of measuring light or the exposure light passing through the first projection optical system with the alternative lens mounted in a state in which the first projection optical system is installed in the exposure apparatus to obtain a sixth measurement result; and
   adjusting a position of the alternative lens on the basis of the sixth measurement result.

5. The lens replacing method according to claim 1,
   wherein the predetermined lens, the master lens, and the alternative lens have almost the same shape and are formed of the same material, and
   wherein the measuring light enters the predetermined lens, the master lens, and the alternative lens so as to pass through the same region in the predetermined lens, the master lens, and the alternative lens in obtaining the first to fourth measurement results.

6. The lens replacing method according to claim 1, wherein a wavelength of the measuring light is equal to a wavelength of the exposure light.

7. The lens replacing method according to claim 1,
   wherein the exposure apparatus is an immersion exposure apparatus that exposes the substrate to light through a liquid, and
   wherein the predetermined lens is a final lens in contact with the liquid.

8. A method for refinishing an alternative lens to a predetermined lens having a non-zero refractive power in a projection optical system configured to project a pattern of an original body illuminated with exposure light onto a substrate, the method comprising:
   mounting the predetermined lens in a first projection optical system;
   measuring a wavefront of measuring light passing through the first projection optical system including the predetermined lens to obtain a first measurement result;
   mounting a master lens corresponding to the predetermined lens in the first projection optical system;
   measuring a wavefront of measuring light passing through the first projection optical system including the master lens to obtain a second measurement result;
   mounting the alternative lens to the predetermined lens in a second projection optical system having the same specifications as those of the first projection optical system;
   measuring a wavefront of measuring light passing through the second projection optical system including the alternative lens to obtain a third measurement result;
   mounting the master lens in the second projection optical system;
   measuring a wavefront of measuring light passing through the second projection optical system including the master lens to obtain a fourth measurement result; and
   processing the alternative lens in accordance with a difference obtained by determining a difference between the difference between the first and second measurement results and the difference between the third and fourth measurement results.

9. The method according to claim 8, further comprising:
   measuring a wavefront of measuring light or the exposure light passing through the first projection optical system with the predetermined lens mounted in a state in which the first projection optical system is installed in the exposure apparatus to obtain a fifth measurement result,
   wherein the alternative lens is processed in accordance with the difference obtained by subtracting the difference between the first and second measurement results from the difference between the third and fourth measurement results, and in accordance with the fifth measurement result.

10. The method according to claim 9,
    wherein the predetermined lens, the master lens, and the alternative lens have almost the same shape and are formed of the same material, and
    wherein the measuring light enters the predetermined lens, the master lens, and the alternative lens so as to pass through the same region in the predetermined lens, the master lens, and the alternative lens in obtaining the first to fifth measurement results.

11. The method according to claim 8,
    wherein the predetermined lens, the master lens, and the alternative lens have almost the same shape and are formed of the same material, and
    wherein the measuring light enters the predetermined lens, the master lens, and the alternative lens so as to pass through the same region in the predetermined lens, the master lens, and the alternative lens in obtaining the first to fourth measurement results.

12. The method according to claim 8, wherein a wavelength of the measuring light is equal to a wavelength of the exposure light.

13. The method according to claim 8,
    wherein the exposure apparatus is an immersion exposure apparatus that exposes the substrate to light through a liquid, and
    wherein the predetermined lens is a final lens in contact with the liquid.

* * * * *